United States Patent [19]

Tsai

[11] Patent Number: 4,800,301

[45] Date of Patent: Jan. 24, 1989

[54] METHOD AND APPARATUS FOR SENSING SIGNALS

[75] Inventor: Sheng J. Tsai, Newtown, Pa.

[73] Assignee: American Telephone and Telegraph Company, New York, N.Y.

[21] Appl. No.: 127,401

[22] Filed: Dec. 2, 1987

[51] Int. Cl.$^4$ ............................................. H03K 5/24
[52] U.S. Cl. .................................. 307/362; 307/491; 307/494; 307/497; 307/310
[58] Field of Search ............... 307/350, 354, 362, 491, 307/494, 497, 310

[56] References Cited

U.S. PATENT DOCUMENTS

| | | | |
|---|---|---|---|
| 4,136,292 | 1/1979 | Suzuki et al. | 307/355 |
| 4,393,315 | 7/1983 | Stickel et al. | 307/362 |
| 4,408,133 | 10/1983 | Cooperman et al. | 307/362 |
| 4,410,815 | 10/1983 | Ransom et al. | 307/264 |
| 4,443,717 | 4/1984 | Haque | 307/362 |
| 4,461,964 | 7/1984 | Shiotari | 307/362 |
| 4,604,533 | 8/1986 | Miyamoto et al. | 307/530 |

Primary Examiner—John Zazworsky

Attorney, Agent, or Firm—Robert B. Levy

[57] ABSTRACT

A comparator circuit (10) for sensing whether an input voltage (Vi) is greater than a reference voltage Vr of predetermined amplitude comprises first and second high-speed FETs (12 and 14), each having its drain-to-source portion coupled in series with a resistor between a voltage source and a current source (20). The FETs are supplied at their respective gates with the input voltage Vi and the reference voltage Vr. When the voltage at the gate of each of the FETs exceeds the voltage at the gate of the other, then the FET having the higher gate voltage conducts and produces a smaller voltage at its drain. The voltage at the drain of one of the FETs is compensated by a compensating network (26) for changes caused by temperature variations. The compensated drain voltage is input to a voltage-sensitive switch (44) which is supplied with a separate one of a pair of indicating voltages having different amplitudes. The switch outputs a separate one of the indicating voltages when the compensated gate voltage exceeds or falls below a predetermined threshold, which occurs when Vi>Vr and Vr>Vi, respectively.

12 Claims, 1 Drawing Sheet

METHOD AND APPARATUS FOR SENSING SIGNALS

BACKGROUND ART

It is common practice in the electronics industry to test a circuit board populated with components by launching one or more test signals into the circuit board and then sensing the level of signals returned in response to the launched test signals. When the circuit board is operating properly, the launching of a test signal of known amplitude into the board causes a response signal of known amplitude to be returned. Thus, by monitoring whether each of the response signals returned from the circuit board has an amplitude greater or less than the known amplitude, defects in the circuit board can be detected.

There presently exist electronic circuits for detecting whether an input signal has an amplitude greater or less than a reference voltage of predetermined amplitude. Such circuits are usually referred to as signal or voltage comparators and are often found in automatic testing machines of the type used to test electronic circuit boards in the manner described above. An example of a prior art voltage comparator circuit is found in U.S. Pat. No. 4,461,964 issued on July 24, 1984 to Shiotari.

The Shiotari comparator is comprised of a first MOS FET of the N channel type coupled between a second and third MOS FET of the N and P channel type, respectively, which are coupled to a voltage source and ground. A fourth MOS FET of the N channel type is coupled between a fifth and sixth MOS FET of the N and P channel type, respectively, which are coupled to the voltage source and to ground. The first and fourth FETs are supplied at their respective gate with an input voltage $V_I$ to be sensed, and a reference voltage $V_R$, respectively, whereas the drain of each of these two FETs is coupled to a separate one of the SET and RESET inputs of an RS flip-flop. The second, third, fifth and sixth FETs are supplied at their gate with a clock pulse $\phi$. During the interval that the second, third, fifth and sixth FETs within the Shiotari comparator are rendered conductive, the RS flip-flop produces a logic "high" level signal at the Q output thereof while the amplitude of $V_I$ exceeds the amplitude of $V_R$. Conversely, if $V_R$ exceeds $V_I$, then the flip-flop outputs a logic "low" level signal at its Q output. Thus, the Q output of the flip-flop provides an indication of whether $V_I$ exceeds $V_R$ or not.

There are several disadvantages believed to be incurred by the Shiotari comparator circuit. The first is that the MOS-type FETs employed by Shiotari have a relatively low maximum switching speed (<100 MHz). As a consequence, the Shiotari comparator circuit is believed to be unable to reliably sense the amplitude of very high frequency (>100 MHz) response signals returned from a circuit board being supplied with test signals of a frequency greater than 100 MHz. Therefore, the Shiotari comparator circuit is believed to be generally unsuited for use within automatic testing machines for testing circuit boards at very high frequencies.

In an effort to increase the operating frequency of the Shiotari comparator circuit, one might consider substituting GaAs-type FETs for the MOS devices. Yet, the substitution of GaAs-type FETs would not likely significantly raise the opening frequency of the Shiotari comparator. As described, the Shiotari circuit employs both P and N channel MOS devices. Only N channel GaAs-type FETs offer a significant speed advantage and hence, the required use of both N- and P-type GaAs devices in the Shiotari comparator would not afford a significant speed advantage.

A further disadvantage of the Shiotari comparator is that the source of each of th first and fourth FETs is held at ground potential which prevents the comparator from reliably indicating whether $V_R$ exceeds $V_I$ when either is an ECL level signal. Therefore, the Shiotari comparator circuit is limited to sensing the level of TTL and CMOS level signals only. Also, the Shiotari comparator lacks any mechanism for compensating the amplitude of the drain voltage of the first and fourth FETs for variations caused by temperature changes. Changes in temperature can adversely affect the operating parameters of these FETs which can affect the voltage at their drain, thereby affecting the level of the input voltage at the SET and RESET inputs of the flip-flop. As a result, the Q output signal of Shiotari's flip-flop may not truly reflect whether $V_R$ exceeds $V_I$.

BRIEF SUMMARY OF THE INVENTION

Briefly, in accordance with a preferred embodiment of the invention, a comparator circuit, for overcoming the aforementioned disadvantages, is comprised of first and second high-speed FETs, typically N channel GaAs-type devices, each having its drain coupled by a separate one of a pair of resistors to a voltage source while the source of each device is coupled to a current source. The gates of the first and second FETs are each supplied with an input voltage Vi to be sensed and a reference voltage Vr of a predetermined magnitude, respectively. The FET which has the higher amplitude signal applied to its gate conducts to the exclusion of the other and thus has a smaller voltage at its drain. Since each of the FETs are coupled between a voltage source and a current source, the voltage at the source of each FET can float in accordance with the potential at the gate of the FET. In this way, each FET can respond to an ECL as well as TTL and CMOS level signal. Because the FETs are high-speed devices, the FETs can change conductivity states very quickly in response to very rapid changes in the amplitude of the input signal. In this way, the FETs can respond to input signals well in excess of 100 MHz.

The drain of one of the FETs is coupled via a level-shifting and temperature-compensating network which comprises the drain voltage for changes due to variations in temperature which affect the operating parameters of the FET. The compensated drain voltage is input to a voltage-sensitive switch which is supplied with a pair of indicating voltages having different amplitudes. The voltage-sensitive switch serves to output a separate one of the indicating voltages when the compensated drain voltage has an amplitude higher than, and lower than, respectively, a predetermined threshold.

In accordance with another preferred embodiment of the invention, an output driver circuit, typically comprised of a FET transistor, is coupled to the output of the voltage-sensitive switch. The output driver circuit serves to adjust the level of the indicating voltage supplied thereto in order to drive a low impedance load, such as a transmission line (having a nominal impedance of 50 ohms).

In accordance with another aspect of the invention, a method is disclosed for sensing whether the amplitude of the input voltage Vi exceeds that of Vr. The method includes the step of applying the input voltage Vi to the gate of a first high-speed FET having its drain coupled by a first resistor to a voltage source and having its source coupled to a current source. The reference voltage Vr is applied to the gate of a second FET which has its drain coupled by a second resistor to the voltage source and has its source coupled to a current source. Each of the FETs produces a voltage at its respective drain which is below the voltage at the drain of the other FET when the amplitude of the voltage at the gate of the FET exceeds the amplitude of the voltage at the gate of the other. The source of each of the FETs, which are each coupled to the current source, is able to "float" so as to allow each FET to respond to ECL as well as TTL and CMOS signals at its gate. Both of the FETs are chosen as high-speed devices so as to be capable of switching in response to rapid changes in the amplitude of the input signal. In this way, the level of a very high frequency signal can be sensed.

The voltage at the drain of one of the two FETs is substantially compensated against variations in temperature. The compensated drain voltage is applied to a voltage-sensitive switch which ouputs a separate one of a pair of indicating voltages, depending on whether the amplitude of the compensated drain voltage is above or below a predetermined threshold level which depends on whether Vi>Vr or not.

DETAILED DESCRIPTION

Figure 1:
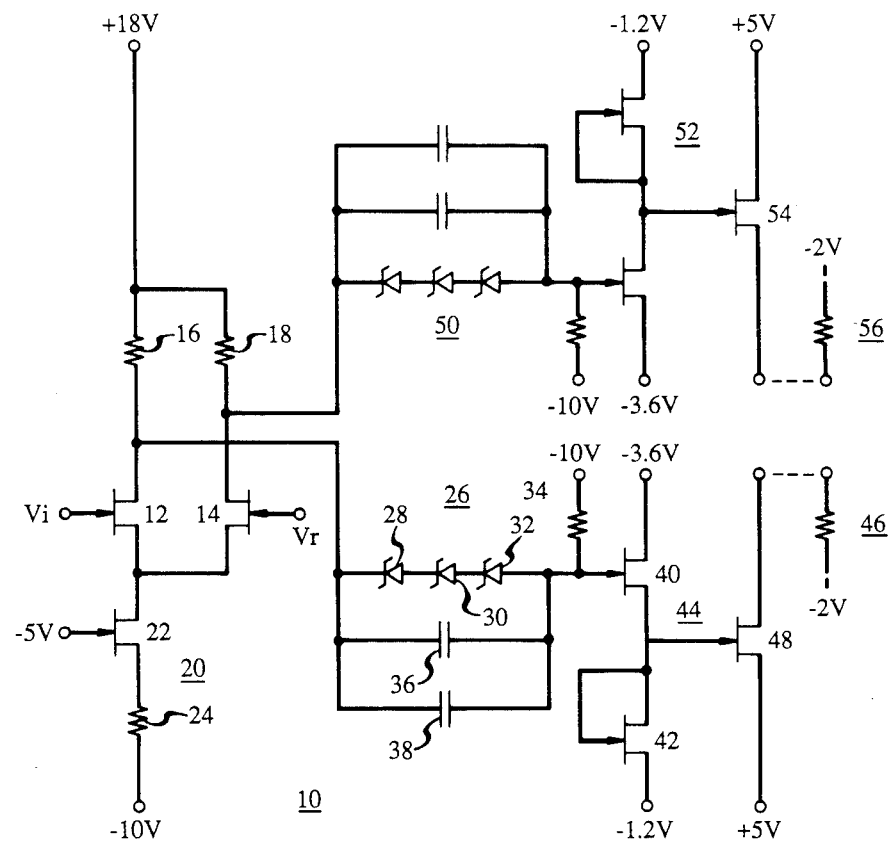
FIG. 1 is a schematic view of a comparator circuit constructed in accordance with the teachings of the present invention.

FIG. 1 is a schematic diagram of a comparator circuit 10 constructed in accordance with the teachings of the present invention for sensing whether an input voltage Vi has a larger amplitude than a reference voltage Vr of predetermined amplitude. The comparator circuit 10 includes first and second field effect transistors 12 and 14 supplied at their individual gates with the input voltage Vi and the reference voltage Vr, respectively. Each of the FETs 12 and 14 has its drain coupled via a separate one of a pair of resistors 16 and 18, respectively, to a dc voltage source (not shown) which supplies a voltage of +18 volts. The source of each of the FETs 12 and 14 is coupled to a current source 20 comprised of an FET 22 whose gate is supplied with a voltage of −5 volts dc. The drain of the FET 22 is coupled to source of both of the FETs 12 and 14 whereas the source of the FET 22 is coupled by a resistor 24 to a voltage source (not shown) which supplies a −10 volt dc voltage.

Since the source of each of the FETs 12 and 14 is coupled to the current source 20, rather than to ground potential, the voltage at the source of each FET can swing in accordance with the level of the voltage present at the gate of each FET. In this way, each of the FETs 12 and 14 can respond to a negative signal, such as an ECL level signal at its gate, in addition to a positive signal, such as a CMOS or TTL level signal. In contrast, were the source of each of the FETs 12 and 14 coupled to ground, rather than to the current source 20, then neither of the FETs would respond to an ECL level signal at its gate.

Those skilled in the art will recognize that the FETs 12 and 14 are coupled in differential fashion. Thus, each of the FETs 12 and 14 conducts to the exclusion of the other when the voltage at the gate of each FET exceeds the voltage at the gate of the other. When one of the FETs 12 and 14 becomes conductive, the voltage at the drain thereof falls below the voltage at the drain of the non-conductive FET. Thus, the conductivity state of the FETs 12 and 14 provides an indication of whether Vi>Vr or not.

In order for the conductivity state of the FETs 12 and 14 to accurately indicate whether Vi>Vr or not, the FETs must be capable of switching at the same frequency as the input voltage Vi. Otherwise, the FETs 12 and 14 may not switch as expected when Vi rises above, or falls below Vr. For this reason, the FETs 12 and 14 are chosen to be high-speed devices, typically N channel GaAs devices, capable of switching at speeds well in excess of 100 MHz. As will become better understood below, the conductivity state of the FETs 12 and 14 is the mechanism employed by the comparator circuit 10 to indicate whether Vi>Vr. Thus, the ability of the FETs 12 and 14 to switch at high frequencies affords the comparator 10 the ability to sense the amplitude of a very high frequency input signal.

The voltage at the drain of the FET 12 is input to a voltage-shifting and temperature-compensating network 26 comprised of three Zener diodes 28, 30 and 32 coupled in series between the drain of the FET 12 and the first terminal of a resistor 34 whose second terminal is coupled to a voltage source (not shown) which supplies a −10 volt dc voltage. The diodes 28, 30 and 32 are of the type which are temperature compensated so that the voltage across the Zener diodes remains substantially constant even if changes in temperature occur which may adversely affect the operating parameters of the FET 12, and hence, the amplitude of the voltage present at the drain thereof. The series combination of the Zener diodes 28, 30 and 32 is shunted by the parallel combination of a pair of capacitors 36 and 38 which serve to reduce the incidence of voltage spikes and also serve to accelerate the discharging of electrons when the voltage at the drain of the FET 12 switches from a high to a low level.

The anode of the Zener diode 32, which forms the output of the compensating network 26, is coupled to the gate of an FET 40 which, together with an FET 42, comprises a voltage-sensitive switch 44. The soruce of the FET 40 is supplied with a dc voltage of −3.6 volts whereas the drain of the FET is coupled to the gate and source of the FET 42 whose drain is supplied a dc voltage of −1.2 volts. Since the gate and source of the FET 42 are coupled together, the FET is always conductive.

The FETs 40 and 42 are selected so that each has a gate width such that the FET 40 becomes conductive and non-conductive when the gate voltage is only slightly greater than, and slightly smaller than, respectively, the threshold voltage of the device, thus facilitating a very sharp transition. The gate width of the FET 40 is typically ten times that of the FET 42.

When the FET 12 is conductive (and the FET 14 is non-conductive), then the voltage at the gate of the FET 40 falls below the threshold voltage for this device. Hence, the FET 40 is non-conductive so that the voltage appearing at the source thereof approximates the voltage supplied to the drain of the FET. As may now be appreciated, the voltage present at the junction of the sources of the FETs 40 and 42, which forms the output of the switch 44, follows the voltage at the drain of each of the FETs when a separate one of the FETs 12 and 14, respectively, is conductive.

The voltages supplied to the drain and source of the FETs 42 and 40, respectively, are referred to as indicating voltages since a separate one of these two voltages is output by the voltage-sensitive switch 44 depending on the level of the voltage applied to the gate of the FET 40. The amplitude of the voltage present at the gate of the FET 40 is dependent on the conductivity of the FET 12. Since the FET 12 is only conductive when the level of the signal Vi exceeds the level of Vr, the particular one of the pair of indicating voltages output by the voltage-sensitive switch 44 is indicative of whether Vi exceeds Vr or not.

In some instances, it is useful to drive a low impedance load (~50 ohms), such as a transmission line 46 (shown as a resistor coupled to a -2 volt voltage supply) with the output voltage of the voltage-sensitive switch 44. However, the impedance of the voltage-sensitive switch 44 is usually too large to effectively drive the transmission line 46. For this reason, the comparator circuit 10 includes an output driver, in the form of an FET 48, whose gate is coupled to the output of the voltage-sensitive switch 44. The drain of the FET 48 is coupled to a voltage source (not shown) which provides a voltage of +5 volts dc. The source of the FET 48 is coupled to the transmission line 46. When the output voltage of the voltage-sensitive switch 44 is above the threshold voltage of the FET 48, the FET becomes conductive to supply the transmission line with a voltage at a first logical level. Conversely, if the output voltage produced by the voltage-sensitive switch is below the threshold value for the FET 48, the FET remains non-conductive, causing the transmission line 46 to be driven with a voltage at second, logical level.

In practice, it is desirable for the FET 48 to drive the transmission line 46 with a separate one of a pair of complementary ECL level signals when Vi>Vi and vice versa. Therefore, the voltage supplied to the gate of the FET 48 from the voltage-sensitive switch 44 must be selected to assure that the voltage present at the drain of the FET will be $\leq -1.1$ volts when the line 46 is to be driven with a "high" ECL signal and $\leq -1.4$ volts when the transmission line is to be driven with a "low" ECL level signal even under worst case conditions. It has been found that by providing the drain and source of the FETs 42 and 40, respectively, with a voltage of $-3.6$ volts and $-1.2$ volts, respectively, the FET 48 will supply the transmission line with an ECL level voltage of $-0.9$ volts and $-1.7$ volts, even under the worst conditions (i.e., a 20% fluctuation in the operating parameters of the FETs), during the intervals when the FET 12 is conductive and non-conductive, respectively. If the transmission line 46 is to be driven by the FET 48 with TTL or CMOS level signals, all that is necessary is to appropriately adjust the levels of the indicating voltages applied to the drain and source of the FETs 42 and 40, respectively.

As thus described, the comparator circuit 10 produces a single ECL level signal whose logic state reflects whether or not the level of the signal Vi exceeds that of Vr. In many instances it is useful to have a pair of complementary ECL level signals indicative of whether or not the level of Vi exceeds that of Vr. One possible solution would be to couple an inverter (not shown) to the source of the FET 48 to provide a signal having a logical level complementary to that appearing at the source of the FET. However, the signal produced by the inverter may not be synchronized to the signal at the source of the FET 48 due to propagation delays which can become significant at very high frequencies.

To overcome this difficulty, the comparator circuit 10 advantageously includes a second voltage-shifting and temperature-compensating network 50, identical to the network 26, a second voltage-sensitive switch 52, identical to the switch 44, and a second driver 54, in the form of an FET identical to the FET 48. The compensating network 50 is coupled to the drain of the FET 14 for shifting the level of the voltage at the drain of the FET and for compensating the voltage for changes in temperature in exactly the same way that the network 26 shifts the level and compensates the voltage at the drain of the FET 12. The network 50 supplies the compensated drain voltage of the FET 14 to the voltage-sensitive switch 52, which like the switch 44, is supplied with a $-1.2$ volt and $-3.6$ volt dc indicating voltages. The switch 52 outputs a separate one the indicating voltages supplied thereto depending on the amplitude of the voltage supplied to the switch from the network 50, which, in turn, is dependent on the conductivity of the FET 14. The voltage output by the voltage-sensitive switch 52 is supplied to the gate of the FET 54 whose drain and source are coupled to a +5 volt dc supply (not shown) and a second transmission line 58 identical to the line 46, respectively.

The overall operation of the comparator 10 is such that when Vi>Vr, then the FET 12 is conductive while the FET 14 is not. As a result, the voltage supplied by the compensating network 26 to the voltage-sensitive switch 44 is below the predetermined threshold voltage of the switch while the voltage supplied by the network 50 to the switch 52 is above the threshold thereof. The switches 44 and 52, in turn, each supply the gate of a separate one of the FETs 48 and 54 with a $-1.2$ and $-3.6$ volt voltage, respectively. Each of the FETs 48 and 54, when supplied with a separate one of the $-1.2$ volt and $-3.6$ volt voltages, respectively, drives a separate one of the transmission lines 46 and 56 with a logic "high" and logic "low" ECL level signal, respectively.

Conversely, when Vr>Vi, then the FETs 12 and 14 are non-conductive and conductive respectively. As a result, the voltage supplied by each of the networks 26 and 50 to the switches 44 and 52 is greater than, and less than, respectively, the threshold for each switch. Each of the switches 44 and 52, in turn supplies the gate of a separate one of the FETs 48 and 56 with a $-3.6$ and $-1.2$ volt voltage, respectively. Each of the FETs 48 and 54, when supplied with a separate one of the $-3.6$ volt and $-1.2$ volt voltages, drives a separate one of the transmission lines 46 and 56 with a logic "low" and logic "high" ECL level signals, respectively. As can be appreciated, the transmission lines 46 and 58 are driven with complementary ECL level signals, the level of each signal being indicative of whether Vi>Vr or not.

Table I contains typical values for the components comprising the comparator circuit 10.

TABLE I

| | |
|---|---|
| Capacitor 36 | 10 nf. |
| Capacitor 38 | 5 pf |
| FETs 12, 14 and 24 | MAF200 Power FETs |
| | (1300 μm gate width) |
| | (MA COMM, Cambridge, MA.) |
| FETs 40, 42 48 | General purpose FETs |
| Resistors 16 and 18 | 400 Ohms |
| Resistor 24 | 1.0K Ohms |
| Resistor 34 | 0.95K Ohms |

TABLE I-continued

| Zenner Diodes 34, 36, and 38 | IC4582A 6.4 volt (Motorola) |

It is to be understood that the that the above-described embodiments are merely illustrative of the principles of the invention. Various modifications and changes may be made thereto by those skilled in the art which will embody the principles of the invention and fall within the spirit and scope thereof.

I claim:

1. A method for sensing whether the amplitude of an input signal exceeds a reference voltage of predetermined amplitude comprising the steps of:
   applying the input signal to the gate of a first field effect transistor (FET) having its drain coupled to a voltage source and having its source at a potential less than that of said voltage source;
   applying the reference voltage to the gate of a second FET having its drain coupled to the voltage source and its source coupled to ground; and
   the first and second FETs each conducting to the exclusion of the other while the amplitude of the signal at the gate of one FET exceeds the amplitude of the signal at the gate of the other FET, CHARACTERIZED IN THAT:
   each of the first and second FETs is a high-speed device and has its drain coupled by a separate one of a pair of resistors to the voltage source and its source coupled to a current source;
   the voltage at the drain of one of the FETs is compensated for variations caused by changes in the operating characteristics of the FETs due to temperature variations; and
   the compensated drain voltage is applied to a voltage-sensitive switch which serves to output a separate one of a pair of indicating voltages having different amplitudes, when the compensated drain voltage has an amplitude larger and smaller, respectively, than a predetermined threshold voltage.

2. The method according to claim 1, CHARACTERIZED IN THAT the output voltage produced by the voltage-sensitive switch is adjusted in order to drive a low impedance load.

3. The method according to claim 1, CHARACTERIZED IN THAT:
   the voltage at the drain of both of the FETs is compensated for variations caused by changes in the operating characteristics of the FETs due to temperature variations; and
   the compensated drain voltage of each FET is applied to a separate one of a pair of voltage-sensitive switches, each supplied with a separate one of a pair of indicating voltages having different amplitudes, each switch serving to output a separate one of the indicating voltages supplied thereto when the compensated drain voltage supplied to the switch has an amplitude larger and smaller, respectively, than a predetermined threshold, the indicating voltage output by each voltage-sensitive switch being indicative of whether the input signal exceeds the reference voltage.

4. The method according to claim 3, CHARACTERIZED IN THAT the output voltage produced by each voltage-sensitive switch is adjusted to drive a low impedance load.

5. A method of testing an electronic device comprising the steps of:
   launching at least one test signal into the device to cause the device to return a signal in response to the test signal; and
   sensing whether the returned signal has an amplitude higher or lower than a voltage of predetermined amplitude, CHARACTERIZED IN THAT said sensing step includes the steps of:
   applying the signal returned from the electronic device to the gate of a first high-speed field effect transistor (FET) having its drain coupled by a first resistor to a voltage source and its source coupled to a current source;
   applying the voltage of predetermined amplitude to the gate of a second high-speed FET having its drain coupled by a second resistor to the voltage source and its source coupled to the current source;
   compensating the voltage at the drain of one of the first and second FETs for changes caused by variations in temperature; and
   applying the compensated drain voltage to the input of a voltage-sensitive switch which serves to output a separate one of a pair of indicating voltages, having different amplitudes, when the the compensated drain voltage is above, and below, respectively, a predetermined threshold, the indicating voltage output by the switch being indicative of whether the input signal has an amplitude greater or smaller than the voltage of predetermined amplitude.

6. The method according to claim 5, CHARACTERIZED IN THAT the output voltage produced by the voltage-sensitive switch is adjusted for driving a low impedance load.

7. The method according to claim 5, CHARACTERIZED IN THAT:
   the voltage at the drain of both of the FETs is compensated for variations caused by changes in the operating characteristics of the FETs due to temperature variations; and
   the compensated drain voltage of each FET is applied to a separate one of a pair of voltage-sensitive switches, each supplied with a separate one of a pair of indicating voltages having different amplitudes, each switch serving to output a separate one of the indicating voltages supplied thereto when the compensated drain voltage supplied to each switch is higher and lower, respectively, than a predetermined threshold, the indicating voltage output by each voltage sensitive switch being indicative of whether the input signal exceeds the reference voltage.

8. The method according to claim 7, CHARACTERIZED IN THAT the output voltage produced by each voltage-sensitive switch is adjusted for driving a low impedance load.

9. A comparator circuit for sensing whether the amplitude of an input voltage exceeds a voltage of predetermined amplitude comprising:
   a first field effect transistor having its gate supplied with the input signal, having its drain coupled to a voltage source and having its source at a potential less than that of said voltage source; and
   a second field effect transistor having its gate supplied with a voltage of predetermined amplitude, and having its drain coupled to the voltage source and its source coupled to ground;
   The particular one of the first and second FETs having the larger amplitude voltage at its gate becoming conductive to the exclusion of the other, thus producing a smaller amplitude voltage of the drain thereof, CHARACTERIZED IN THAT:

each of the first and second field effect transistors is a high-speed device, having its drain coupled by a separate one of a pair of resistors to the voltage source and having its source coupled to a current source;

a compensating network is coupled to the drain of one of the FETs for compensating the voltage thereat for changes caused by variations in temperature; and a voltage-sensitive switch is coupled to the compensating network, the voltage-sensitive switch being supplied with a pair of indicating voltages having different amplitudes, and serving to output a separate one of the indicating voltages when the compensated drain voltage has an amplitude greater and smaller, respectively, than a predetermined threshold.

10. The apparatus according to claim 9, CHARACTERIZED IN THAT a driver stage is coupled to the output of the voltage-sensitive switch for adjusting the level of the indicating voltage output produced by the switch.

11. The apparatus according to claim 9, CHARACTERIZED IN THAT:

a second compensating network is coupled to the drain of the other of the FETs for compensating the voltage thereat for changes caused by variations in temperature; and a second voltage-sensitive switch is coupled to the second compensating network, the voltage-sensitive switch being supplied with a pair of indicating voltages of a pair of indicating voltages having different amplitudes, the switch outputting a separate one of the indicating voltages when the compensated drain voltage has an amplitude greater and smaller, respectively, than a predetermined threshold.

12. The apparatus according to claim 11, CHARACTERIZED IN THAT a second driver stage is coupled to the output of the second voltage-sensitive switch for adjusting the level of the indicating voltage output by the switch.

* * * * *